US009236560B1

(12) United States Patent
Li et al.

(10) Patent No.: US 9,236,560 B1
(45) Date of Patent: Jan. 12, 2016

(54) SPIN TRANSFER TORQUE TUNNELING MAGNETORESISTIVE DEVICE HAVING A LAMINATED FREE LAYER WITH PERPENDICULAR MAGNETIC ANISOTROPY

(71) Applicant: Western Digital (Fremont), LLC, Fremont, CA (US)

(72) Inventors: Shaoping Li, San Ramon, CA (US); Gerardo A. Bertero, Redwood City, CA (US); Yuankai Zheng, Fremont, CA (US); Qunwen Leng, Palo Alto, CA (US); Shihai He, Fremont, CA (US); Yunfei Ding, Fremont, CA (US); Ming Mao, Dublin, CA (US); Abhinandan Chougule, Gilroy, CA (US); Daniel K. Lottis, Sunnyvale, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 0 days.

(21) Appl. No.: 14/563,721

(22) Filed: Dec. 8, 2014

(51) Int. Cl.
| | |
|---|---|
| *H01L 27/22* | (2006.01) |
| *H01L 43/08* | (2006.01) |
| *H01L 43/02* | (2006.01) |
| *H01L 43/10* | (2006.01) |
| *H01F 10/32* | (2006.01) |

(52) U.S. Cl.
CPC ............... *H01L 43/08* (2013.01); *H01L 43/02* (2013.01); *H01L 43/10* (2013.01); *H01F 10/3254* (2013.01); *H01F 10/3286* (2013.01)

(58) Field of Classification Search
CPC . B82Y 25/00; H01F 10/3254; H01F 10/3286; H01F 10/329; H01F 10/3268
See application file for complete search history.

(56) References Cited

U.S. PATENT DOCUMENTS

| | | |
|---|---|---|
| 6,016,290 A | 1/2000 | Chen et al. |
| 6,018,441 A | 1/2000 | Wu et al. |
| 6,025,978 A | 2/2000 | Hoshi et al. |
| 6,025,988 A | 2/2000 | Yan |
| 6,032,353 A | 3/2000 | Hiner et al. |
| 6,033,532 A | 3/2000 | Minami |
| 6,034,851 A | 3/2000 | Zarouri et al. |
| 6,043,959 A | 3/2000 | Crue et al. |
| 6,046,885 A | 4/2000 | Aimonetti et al. |
| 6,049,650 A | 4/2000 | Jerman et al. |
| 6,055,138 A | 4/2000 | Shi |
| 6,058,094 A | 5/2000 | Davis et al. |
| 6,073,338 A | 6/2000 | Liu et al. |
| 6,078,479 A | 6/2000 | Nepela et al. |
| 6,081,499 A | 6/2000 | Berger et al. |
| 6,094,803 A | 8/2000 | Carlson et al. |
| 6,099,362 A | 8/2000 | Viches et al. |
| 6,103,073 A | 8/2000 | Thayamballi |

(Continued)

*Primary Examiner* — John C Ingham (57) ABSTRACT

A spin transfer torque magnetic junction includes a magnetic reference layer structure with magnetic anisotropy perpendicular to a substrate plane. A laminated magnetic free layer comprises at least three sublayers (e.g. sub-layers of 6 to 30 Angstroms of CoFeB, CoPt, FePt, or CoPd) having magnetic anisotropy perpendicular to the substrate plane. Each such sublayer is separated from an adjacent one by a tantalum dusting layer. An insulative barrier layer (e.g. MgO) is disposed between the laminated free layer and the magnetic reference layer structure. The spin transfer torque magnetic junction includes conductive base and top electrodes, and a current polarizing structure that has magnetic anisotropy parallel to the substrate plane. In certain embodiments, the current polarizing structure may also include a non-magnetic spacer layer (e.g. MgO, copper, etc).

20 Claims, 3 Drawing Sheets

(56) References Cited

U.S. PATENT DOCUMENTS

| | | |
|---|---|---|
| 6,108,166 A | 8/2000 | Lederman |
| 6,118,629 A | 9/2000 | Huai et al. |
| 6,118,638 A | 9/2000 | Knapp et al. |
| 6,125,018 A | 9/2000 | Takagishi et al. |
| 6,130,779 A | 10/2000 | Carlson et al. |
| 6,134,089 A | 10/2000 | Barr et al. |
| 6,136,166 A | 10/2000 | Shen et al. |
| 6,137,661 A | 10/2000 | Shi et al. |
| 6,137,662 A | 10/2000 | Huai et al. |
| 6,160,684 A | 12/2000 | Heist et al. |
| 6,163,426 A | 12/2000 | Nepela et al. |
| 6,166,891 A | 12/2000 | Lederman et al. |
| 6,173,486 B1 | 1/2001 | Hsiao et al. |
| 6,175,476 B1 | 1/2001 | Huai et al. |
| 6,178,066 B1 | 1/2001 | Barr |
| 6,178,070 B1 | 1/2001 | Hong et al. |
| 6,178,150 B1 | 1/2001 | Davis |
| 6,181,485 B1 | 1/2001 | He |
| 6,181,525 B1 | 1/2001 | Carlson |
| 6,185,051 B1 | 2/2001 | Chen et al. |
| 6,185,077 B1 | 2/2001 | Tong et al. |
| 6,185,081 B1 | 2/2001 | Simion et al. |
| 6,188,549 B1 | 2/2001 | Wiitala |
| 6,190,764 B1 | 2/2001 | Shi et al. |
| 6,193,584 B1 | 2/2001 | Rudy et al. |
| 6,195,229 B1 | 2/2001 | Shen et al. |
| 6,198,608 B1 | 3/2001 | Hong et al. |
| 6,198,609 B1 | 3/2001 | Barr et al. |
| 6,201,673 B1 | 3/2001 | Rottmayer et al. |
| 6,204,998 B1 | 3/2001 | Katz |
| 6,204,999 B1 | 3/2001 | Crue et al. |
| 6,212,153 B1 | 4/2001 | Chen et al. |
| 6,215,625 B1 | 4/2001 | Carlson |
| 6,219,205 B1 | 4/2001 | Yuan et al. |
| 6,221,218 B1 | 4/2001 | Shi et al. |
| 6,222,707 B1 | 4/2001 | Huai et al. |
| 6,229,782 B1 | 5/2001 | Wang et al. |
| 6,230,959 B1 | 5/2001 | Heist et al. |
| 6,233,116 B1 | 5/2001 | Chen et al. |
| 6,233,125 B1 | 5/2001 | Knapp et al. |
| 6,237,215 B1 | 5/2001 | Hunsaker et al. |
| 6,252,743 B1 | 6/2001 | Bozorgi |
| 6,255,721 B1 | 7/2001 | Roberts |
| 6,258,468 B1 | 7/2001 | Mahvan et al. |
| 6,266,216 B1 | 7/2001 | Hikami et al. |
| 6,271,604 B1 | 8/2001 | Frank, Jr. et al. |
| 6,275,354 B1 | 8/2001 | Huai et al. |
| 6,277,505 B1 | 8/2001 | Shi et al. |
| 6,282,056 B1 | 8/2001 | Feng et al. |
| 6,296,955 B1 | 10/2001 | Hossain et al. |
| 6,297,955 B1 | 10/2001 | Frank, Jr. et al. |
| 6,304,414 B1 | 10/2001 | Crue, Jr. et al. |
| 6,307,715 B1 | 10/2001 | Berding et al. |
| 6,310,746 B1 | 10/2001 | Hawwa et al. |
| 6,310,750 B1 | 10/2001 | Hawwa et al. |
| 6,317,290 B1 | 11/2001 | Wang et al. |
| 6,317,297 B1 | 11/2001 | Tong et al. |
| 6,322,911 B1 | 11/2001 | Fukagawa et al. |
| 6,330,136 B1 | 12/2001 | Wang et al. |
| 6,330,137 B1 | 12/2001 | Knapp et al. |
| 6,333,830 B2 | 12/2001 | Rose et al. |
| 6,340,533 B1 | 1/2002 | Ueno et al. |
| 6,349,014 B1 | 2/2002 | Crue, Jr. et al. |
| 6,351,355 B1 | 2/2002 | Min et al. |
| 6,353,318 B1 | 3/2002 | Sin et al. |
| 6,353,511 B1 | 3/2002 | Shi et al. |
| 6,356,412 B1 | 3/2002 | Levi et al. |
| 6,359,779 B1 | 3/2002 | Frank, Jr. et al. |
| 6,369,983 B1 | 4/2002 | Hong |
| 6,376,964 B1 | 4/2002 | Young et al. |
| 6,377,535 B1 | 4/2002 | Chen et al. |
| 6,381,095 B1 | 4/2002 | Sin et al. |
| 6,381,105 B1 | 4/2002 | Huai et al. |
| 6,389,499 B1 | 5/2002 | Frank, Jr. et al. |
| 6,392,850 B1 | 5/2002 | Tong et al. |
| 6,396,660 B1 | 5/2002 | Jensen et al. |
| 6,399,179 B1 | 6/2002 | Hanrahan et al. |
| 6,400,526 B2 | 6/2002 | Crue, Jr. et al. |
| 6,404,600 B1 | 6/2002 | Hawwa et al. |
| 6,404,601 B1 | 6/2002 | Rottmayer et al. |
| 6,404,706 B1 | 6/2002 | Stovall et al. |
| 6,410,170 B1 | 6/2002 | Chen et al. |
| 6,411,522 B1 | 6/2002 | Frank, Jr. et al. |
| 6,417,998 B1 | 7/2002 | Crue, Jr. et al. |
| 6,417,999 B1 | 7/2002 | Knapp et al. |
| 6,418,000 B1 | 7/2002 | Gibbons et al. |
| 6,418,048 B1 | 7/2002 | Sin et al. |
| 6,421,211 B1 | 7/2002 | Hawwa et al. |
| 6,421,212 B1 | 7/2002 | Gibbons et al. |
| 6,424,505 B1 | 7/2002 | Lam et al. |
| 6,424,507 B1 | 7/2002 | Lederman et al. |
| 6,430,009 B1 | 8/2002 | Komaki et al. |
| 6,430,806 B1 | 8/2002 | Chen et al. |
| 6,433,965 B1 | 8/2002 | Gopinathan et al. |
| 6,433,968 B1 | 8/2002 | Shi et al. |
| 6,433,970 B1 | 8/2002 | Knapp et al. |
| 6,437,945 B1 | 8/2002 | Hawwa et al. |
| 6,445,536 B1 | 9/2002 | Rudy et al. |
| 6,445,542 B1 | 9/2002 | Levi et al. |
| 6,445,553 B2 | 9/2002 | Barr et al. |
| 6,445,554 B1 | 9/2002 | Dong et al. |
| 6,447,935 B1 | 9/2002 | Zhang et al. |
| 6,448,765 B1 | 9/2002 | Chen et al. |
| 6,451,514 B1 | 9/2002 | Iitsuka |
| 6,452,742 B1 | 9/2002 | Crue et al. |
| 6,452,765 B1 | 9/2002 | Mahvan et al. |
| 6,456,465 B1 | 9/2002 | Louis et al. |
| 6,459,552 B1 | 10/2002 | Liu et al. |
| 6,462,920 B1 | 10/2002 | Karimi |
| 6,466,401 B1 | 10/2002 | Hong et al. |
| 6,466,402 B1 | 10/2002 | Crue, Jr. et al. |
| 6,466,404 B1 | 10/2002 | Crue, Jr. et al. |
| 6,468,436 B1 | 10/2002 | Shi et al. |
| 6,469,877 B1 | 10/2002 | Knapp et al. |
| 6,477,019 B2 | 11/2002 | Matono et al. |
| 6,479,096 B1 | 11/2002 | Shi et al. |
| 6,483,662 B1 | 11/2002 | Thomas et al. |
| 6,487,040 B1 | 11/2002 | Hsiao et al. |
| 6,487,056 B1 | 11/2002 | Gibbons et al. |
| 6,490,125 B1 | 12/2002 | Barr |
| 6,496,330 B1 | 12/2002 | Crue, Jr. et al. |
| 6,496,334 B1 | 12/2002 | Pang et al. |
| 6,504,676 B1 | 1/2003 | Hiner et al. |
| 6,512,657 B2 | 1/2003 | Heist et al. |
| 6,512,659 B1 | 1/2003 | Hawwa et al. |
| 6,512,661 B1 | 1/2003 | Louis |
| 6,512,690 B1 | 1/2003 | Qi et al. |
| 6,515,573 B1 | 2/2003 | Dong et al. |
| 6,515,791 B1 | 2/2003 | Hawwa et al. |
| 6,532,823 B1 | 3/2003 | Knapp et al. |
| 6,535,363 B1 | 3/2003 | Hosomi et al. |
| 6,552,874 B1 | 4/2003 | Chen et al. |
| 6,552,928 B1 | 4/2003 | Qi et al. |
| 6,577,470 B1 | 6/2003 | Rumpler |
| 6,583,961 B2 | 6/2003 | Levi et al. |
| 6,583,968 B1 | 6/2003 | Scura et al. |
| 6,597,548 B1 | 7/2003 | Yamanaka et al. |
| 6,611,398 B1 | 8/2003 | Rumpler et al. |
| 6,618,223 B1 | 9/2003 | Chen et al. |
| 6,629,357 B1 | 10/2003 | Akoh |
| 6,633,464 B2 | 10/2003 | Lai et al. |
| 6,636,394 B1 | 10/2003 | Fukagawa et al. |
| 6,639,291 B1 | 10/2003 | Sin et al. |
| 6,650,503 B1 | 11/2003 | Chen et al. |
| 6,650,506 B1 | 11/2003 | Risse |
| 6,654,195 B1 | 11/2003 | Frank, Jr. et al. |
| 6,657,816 B1 | 12/2003 | Barr et al. |
| 6,661,621 B1 | 12/2003 | Iitsuka |
| 6,661,625 B1 | 12/2003 | Sin et al. |
| 6,674,610 B1 | 1/2004 | Thomas et al. |
| 6,680,863 B1 | 1/2004 | Shi et al. |
| 6,683,763 B1 | 1/2004 | Hiner et al. |
| 6,687,098 B1 | 2/2004 | Huai |
| 6,687,178 B1 | 2/2004 | Qi et al. |

(56) References Cited

U.S. PATENT DOCUMENTS

| | | |
|---|---|---|
| 6,687,977 B2 | 2/2004 | Knapp et al. |
| 6,691,226 B1 | 2/2004 | Frank, Jr. et al. |
| 6,697,294 B1 | 2/2004 | Qi et al. |
| 6,700,738 B1 | 3/2004 | Sin et al. |
| 6,700,759 B1 | 3/2004 | Knapp et al. |
| 6,704,158 B2 | 3/2004 | Hawwa et al. |
| 6,707,083 B1 | 3/2004 | Hiner et al. |
| 6,713,801 B1 | 3/2004 | Sin et al. |
| 6,721,138 B1 | 4/2004 | Chen et al. |
| 6,721,149 B1 | 4/2004 | Shi et al. |
| 6,721,203 B1 | 4/2004 | Qi et al. |
| 6,724,569 B1 | 4/2004 | Chen et al. |
| 6,724,572 B1 | 4/2004 | Stoev et al. |
| 6,729,015 B2 | 5/2004 | Matono et al. |
| 6,735,850 B1 | 5/2004 | Gibbons et al. |
| 6,737,281 B1 | 5/2004 | Dang et al. |
| 6,744,608 B1 | 6/2004 | Sin et al. |
| 6,747,301 B1 | 6/2004 | Hiner et al. |
| 6,751,055 B1 | 6/2004 | Alfoqaha et al. |
| 6,754,049 B1 | 6/2004 | Seagle et al. |
| 6,756,071 B1 | 6/2004 | Shi et al. |
| 6,757,140 B1 | 6/2004 | Hawwa |
| 6,760,196 B1 | 7/2004 | Niu et al. |
| 6,762,910 B1 | 7/2004 | Knapp et al. |
| 6,765,756 B1 | 7/2004 | Hong et al. |
| 6,775,902 B1 | 8/2004 | Huai et al. |
| 6,778,358 B1 | 8/2004 | Jiang et al. |
| 6,781,927 B1 | 8/2004 | Heanuc et al. |
| 6,785,955 B1 | 9/2004 | Chen et al. |
| 6,791,793 B1 | 9/2004 | Chen et al. |
| 6,791,807 B1 | 9/2004 | Hikami et al. |
| 6,798,616 B1 | 9/2004 | Seagle et al. |
| 6,798,625 B1 | 9/2004 | Ueno et al. |
| 6,801,408 B1 | 10/2004 | Chen et al. |
| 6,801,411 B1 | 10/2004 | Lederman et al. |
| 6,803,615 B1 | 10/2004 | Sin et al. |
| 6,806,035 B1 | 10/2004 | Atireklapvarodom et al. |
| 6,807,030 B1 | 10/2004 | Hawwa et al. |
| 6,807,332 B1 | 10/2004 | Hawwa |
| 6,809,899 B1 | 10/2004 | Chen et al. |
| 6,816,345 B1 | 11/2004 | Knapp et al. |
| 6,828,897 B1 | 12/2004 | Nepela |
| 6,829,160 B1 | 12/2004 | Qi et al. |
| 6,829,819 B1 | 12/2004 | Crue, Jr. et al. |
| 6,833,979 B1 | 12/2004 | Knapp et al. |
| 6,834,010 B1 | 12/2004 | Qi et al. |
| 6,859,343 B1 | 2/2005 | Alfoqaha et al. |
| 6,859,997 B1 | 3/2005 | Tong et al. |
| 6,861,937 B1 | 3/2005 | Feng et al. |
| 6,870,712 B2 | 3/2005 | Chen et al. |
| 6,873,494 B2 | 3/2005 | Chen et al. |
| 6,873,547 B1 | 3/2005 | Shi et al. |
| 6,879,464 B2 | 4/2005 | Sun et al. |
| 6,888,184 B1 | 5/2005 | Shi et al. |
| 6,888,704 B1 | 5/2005 | Diao et al. |
| 6,891,702 B1 | 5/2005 | Tang |
| 6,894,871 B2 | 5/2005 | Alfoqaha et al. |
| 6,894,877 B1 | 5/2005 | Crue, Jr. et al. |
| 6,906,894 B2 | 6/2005 | Chen et al. |
| 6,909,578 B1 | 6/2005 | Missell et al. |
| 6,912,106 B1 | 6/2005 | Chen et al. |
| 6,934,113 B1 | 8/2005 | Chen |
| 6,934,129 B1 | 8/2005 | Zhang et al. |
| 6,940,688 B2 | 9/2005 | Jiang et al. |
| 6,942,824 B1 | 9/2005 | Li |
| 6,943,993 B2 | 9/2005 | Chang et al. |
| 6,944,938 B1 | 9/2005 | Crue, Jr. et al. |
| 6,947,258 B1 | 9/2005 | Li |
| 6,950,266 B1 | 9/2005 | McCaslin et al. |
| 6,954,332 B1 | 10/2005 | Hong et al. |
| 6,958,885 B1 | 10/2005 | Chen et al. |
| 6,961,221 B1 | 11/2005 | Niu et al. |
| 6,969,989 B1 | 11/2005 | Mei |
| 6,975,486 B2 | 12/2005 | Chen et al. |
| 6,987,643 B1 | 1/2006 | Seagle |
| 6,989,962 B1 | 1/2006 | Dong et al. |
| 6,989,972 B1 | 1/2006 | Stoev et al. |
| 7,006,327 B2 | 2/2006 | Krounbi et al. |
| 7,007,372 B1 | 3/2006 | Chen et al. |
| 7,012,832 B1 | 3/2006 | Sin et al. |
| 7,023,658 B1 | 4/2006 | Knapp et al. |
| 7,026,063 B2 | 4/2006 | Ueno et al. |
| 7,027,268 B1 | 4/2006 | Zhu et al. |
| 7,027,274 B1 | 4/2006 | Sin et al. |
| 7,035,046 B1 | 4/2006 | Young et al. |
| 7,041,985 B1 | 5/2006 | Wang et al. |
| 7,046,490 B1 | 5/2006 | Ueno et al. |
| 7,054,113 B1 | 5/2006 | Seagle et al. |
| 7,057,857 B1 | 6/2006 | Niu et al. |
| 7,059,868 B1 | 6/2006 | Yan |
| 7,092,195 B1 | 8/2006 | Liu et al. |
| 7,110,289 B1 | 9/2006 | Sin et al. |
| 7,111,382 B1 | 9/2006 | Knapp et al. |
| 7,113,366 B1 | 9/2006 | Wang et al. |
| 7,114,241 B2 | 10/2006 | Kubota et al. |
| 7,116,517 B1 | 10/2006 | He et al. |
| 7,124,654 B1 | 10/2006 | Davies et al. |
| 7,126,788 B1 | 10/2006 | Liu et al. |
| 7,126,790 B1 | 10/2006 | Liu et al. |
| 7,131,346 B1 | 11/2006 | Buttar et al. |
| 7,133,253 B1 | 11/2006 | Seagle et al. |
| 7,134,185 B1 | 11/2006 | Knapp et al. |
| 7,154,715 B2 | 12/2006 | Yamanaka et al. |
| 7,170,725 B1 | 1/2007 | Zhou et al. |
| 7,177,117 B1 | 2/2007 | Jiang et al. |
| 7,193,815 B1 | 3/2007 | Stoev et al. |
| 7,196,880 B1 | 3/2007 | Anderson et al. |
| 7,199,974 B1 | 4/2007 | Alfoqaha |
| 7,199,975 B1 | 4/2007 | Pan |
| 7,211,339 B1 | 5/2007 | Seagle et al. |
| 7,212,384 B1 | 5/2007 | Stoev et al. |
| 7,238,292 B1 | 7/2007 | He et al. |
| 7,239,478 B1 | 7/2007 | Sin et al. |
| 7,248,431 B1 | 7/2007 | Liu et al. |
| 7,248,433 B1 | 7/2007 | Stoev et al. |
| 7,248,449 B1 | 7/2007 | Seagle |
| 7,280,325 B1 | 10/2007 | Pan |
| 7,283,327 B1 | 10/2007 | Liu et al. |
| 7,284,316 B1 | 10/2007 | Huai et al. |
| 7,286,329 B1 | 10/2007 | Chen et al. |
| 7,289,303 B1 | 10/2007 | Sin et al. |
| 7,292,409 B1 | 11/2007 | Stoev et al. |
| 7,296,339 B1 | 11/2007 | Yang et al. |
| 7,307,814 B1 | 12/2007 | Seagle et al. |
| 7,307,818 B1 | 12/2007 | Park et al. |
| 7,310,204 B1 | 12/2007 | Stoev et al. |
| 7,318,947 B1 | 1/2008 | Park et al. |
| 7,333,295 B1 | 2/2008 | Medina et al. |
| 7,337,530 B1 | 3/2008 | Stoev et al. |
| 7,342,752 B1 | 3/2008 | Zhang et al. |
| 7,349,170 B1 | 3/2008 | Rudman et al. |
| 7,349,179 B1 | 3/2008 | He et al. |
| 7,354,664 B1 | 4/2008 | Jiang et al. |
| 7,363,697 B1 | 4/2008 | Dunn et al. |
| 7,371,152 B1 | 5/2008 | Newman |
| 7,372,665 B1 | 5/2008 | Stoev et al. |
| 7,375,926 B1 | 5/2008 | Stoev et al. |
| 7,379,269 B1 | 5/2008 | Krounbi et al. |
| 7,386,933 B1 | 6/2008 | Krounbi et al. |
| 7,389,577 B1 | 6/2008 | Shang et al. |
| 7,417,832 B1 | 8/2008 | Erickson et al. |
| 7,419,891 B1 | 9/2008 | Chen et al. |
| 7,428,124 B1 | 9/2008 | Song et al. |
| 7,430,098 B1 | 9/2008 | Song et al. |
| 7,436,620 B1 | 10/2008 | Kang et al. |
| 7,436,638 B1 | 10/2008 | Pan |
| 7,440,220 B1 | 10/2008 | Kang et al. |
| 7,443,632 B1 | 10/2008 | Stoev et al. |
| 7,444,740 B1 | 11/2008 | Chung et al. |
| 7,493,688 B1 | 2/2009 | Wang et al. |
| 7,508,627 B1 | 3/2009 | Zhang et al. |
| 7,522,377 B1 | 4/2009 | Jiang et al. |
| 7,522,379 B1 | 4/2009 | Krounbi et al. |
| 7,522,382 B1 | 4/2009 | Pan |

(56) References Cited

U.S. PATENT DOCUMENTS

| | | |
|---|---|---|
| 7,542,246 B1 | 6/2009 | Song et al. |
| 7,551,406 B1 | 6/2009 | Thomas et al. |
| 7,552,523 B1 | 6/2009 | He et al. |
| 7,554,767 B1 | 6/2009 | Hu et al. |
| 7,583,466 B2 | 9/2009 | Kermiche et al. |
| 7,595,967 B1 | 9/2009 | Moon et al. |
| 7,639,457 B1 | 12/2009 | Chen et al. |
| 7,660,080 B1 | 2/2010 | Liu et al. |
| 7,672,080 B1 | 3/2010 | Tang et al. |
| 7,672,086 B1 | 3/2010 | Jiang |
| 7,684,160 B1 | 3/2010 | Erickson et al. |
| 7,688,546 B1 | 3/2010 | Bai et al. |
| 7,691,434 B1 | 4/2010 | Zhang et al. |
| 7,695,761 B1 | 4/2010 | Shen et al. |
| 7,719,795 B2 | 5/2010 | Hu et al. |
| 7,726,009 B1 | 6/2010 | Liu et al. |
| 7,729,086 B1 | 6/2010 | Song et al. |
| 7,729,087 B1 | 6/2010 | Stoev et al. |
| 7,736,823 B1 | 6/2010 | Wang et al. |
| 7,785,666 B1 | 8/2010 | Sun et al. |
| 7,796,356 B1 | 9/2010 | Fowler et al. |
| 7,800,858 B1 | 9/2010 | Bajikar et al. |
| 7,819,979 B1 | 10/2010 | Chen et al. |
| 7,829,264 B1 | 11/2010 | Wang et al. |
| 7,846,643 B1 | 12/2010 | Sun et al. |
| 7,855,854 B2 | 12/2010 | Hu et al. |
| 7,869,160 B1 | 1/2011 | Pan et al. |
| 7,872,824 B1 | 1/2011 | Macchioni et al. |
| 7,872,833 B2 | 1/2011 | Hu et al. |
| 7,910,267 B1 | 3/2011 | Zeng et al. |
| 7,911,735 B1 | 3/2011 | Sin et al. |
| 7,911,737 B1 | 3/2011 | Jiang et al. |
| 7,916,426 B2 | 3/2011 | Hu et al. |
| 7,918,013 B1 | 4/2011 | Dunn et al. |
| 7,965,543 B2 | 6/2011 | Slaughter et al. |
| 7,968,219 B1 | 6/2011 | Jiang et al. |
| 7,982,989 B1 | 7/2011 | Shi et al. |
| 8,008,912 B1 | 8/2011 | Shang |
| 8,012,804 B1 | 9/2011 | Wang et al. |
| 8,015,692 B1 | 9/2011 | Zhang et al. |
| 8,018,677 B1 | 9/2011 | Chung et al. |
| 8,018,678 B1 | 9/2011 | Zhang et al. |
| 8,024,748 B1 | 9/2011 | Moravec et al. |
| 8,072,705 B1 | 12/2011 | Wang et al. |
| 8,074,345 B1 | 12/2011 | Anguelouch et al. |
| 8,077,418 B1 | 12/2011 | Hu et al. |
| 8,077,434 B1 | 12/2011 | Shen et al. |
| 8,077,435 B1 | 12/2011 | Liu et al. |
| 8,077,557 B1 | 12/2011 | Hu et al. |
| 8,079,135 B1 | 12/2011 | Shen et al. |
| 8,081,403 B1 | 12/2011 | Chen et al. |
| 8,091,210 B1 | 1/2012 | Sasaki et al. |
| 8,097,846 B1 | 1/2012 | Anguelouch et al. |
| 8,104,166 B1 | 1/2012 | Zhang et al. |
| 8,107,280 B2 | 1/2012 | Yoon et al. |
| 8,116,043 B2 | 2/2012 | Leng et al. |
| 8,116,171 B1 | 2/2012 | Lee |
| 8,125,856 B1 | 2/2012 | Li et al. |
| 8,134,794 B1 | 3/2012 | Wang |
| 8,136,224 B1 | 3/2012 | Sun et al. |
| 8,136,225 B1 | 3/2012 | Zhang et al. |
| 8,136,805 B1 | 3/2012 | Lee |
| 8,141,235 B1 | 3/2012 | Zhang |
| 8,146,236 B1 | 4/2012 | Luo et al. |
| 8,149,536 B1 | 4/2012 | Yang et al. |
| 8,151,441 B1 | 4/2012 | Rudy et al. |
| 8,163,185 B1 | 4/2012 | Sun et al. |
| 8,164,760 B2 | 4/2012 | Willis |
| 8,164,855 B1 | 4/2012 | Gibbons et al. |
| 8,164,864 B2 | 4/2012 | Kaiser et al. |
| 8,165,709 B1 | 4/2012 | Rudy |
| 8,166,631 B1 | 5/2012 | Tran et al. |
| 8,166,632 B1 | 5/2012 | Zhang et al. |
| 8,169,473 B1 | 5/2012 | Yu et al. |
| 8,171,618 B1 | 5/2012 | Wang et al. |
| 8,179,636 B1 | 5/2012 | Bai et al. |
| 8,191,237 B1 | 6/2012 | Luo et al. |
| 8,194,365 B1 | 6/2012 | Leng et al. |
| 8,194,366 B1 | 6/2012 | Li et al. |
| 8,196,285 B1 | 6/2012 | Zhang et al. |
| 8,200,054 B1 | 6/2012 | Li et al. |
| 8,203,800 B2 | 6/2012 | Li et al. |
| 8,208,350 B1 | 6/2012 | Hu et al. |
| 8,220,140 B1 | 7/2012 | Wang et al. |
| 8,222,599 B1 | 7/2012 | Chien |
| 8,225,488 B1 | 7/2012 | Zhang et al. |
| 8,227,023 B1 | 7/2012 | Liu et al. |
| 8,228,633 B1 | 7/2012 | Tran et al. |
| 8,231,796 B1 | 7/2012 | Li et al. |
| 8,233,248 B1 | 7/2012 | Li et al. |
| 8,248,896 B1 | 8/2012 | Yuan et al. |
| 8,254,060 B1 | 8/2012 | Shi et al. |
| 8,257,597 B1 | 9/2012 | Guan et al. |
| 8,259,410 B1 | 9/2012 | Bai et al. |
| 8,259,539 B1 | 9/2012 | Hu et al. |
| 8,262,918 B1 | 9/2012 | Li et al. |
| 8,262,919 B1 | 9/2012 | Luo et al. |
| 8,264,797 B2 | 9/2012 | Emley |
| 8,264,798 B1 | 9/2012 | Guan et al. |
| 8,270,126 B1 | 9/2012 | Roy et al. |
| 8,276,258 B1 | 10/2012 | Tran et al. |
| 8,277,669 B1 | 10/2012 | Chen et al. |
| 8,279,719 B1 | 10/2012 | Hu et al. |
| 8,284,517 B1 | 10/2012 | Sun et al. |
| 8,288,204 B1 | 10/2012 | Wang et al. |
| 8,289,821 B1 | 10/2012 | Huber |
| 8,291,743 B1 | 10/2012 | Shi et al. |
| 8,307,539 B1 | 11/2012 | Rudy et al. |
| 8,307,540 B1 | 11/2012 | Tran et al. |
| 8,308,921 B1 | 11/2012 | Hiner et al. |
| 8,310,785 B1 | 11/2012 | Zhang et al. |
| 8,310,901 B1 | 11/2012 | Batra et al. |
| 8,315,019 B1 | 11/2012 | Mao et al. |
| 8,316,527 B2 | 11/2012 | Hong et al. |
| 8,320,076 B1 | 11/2012 | Shen et al. |
| 8,320,077 B1 | 11/2012 | Tang et al. |
| 8,320,219 B1 | 11/2012 | Wolf et al. |
| 8,320,220 B1 | 11/2012 | Yuan et al. |
| 8,320,722 B1 | 11/2012 | Yuan et al. |
| 8,322,022 B1 | 12/2012 | Yi et al. |
| 8,322,023 B1 | 12/2012 | Zeng et al. |
| 8,325,569 B1 | 12/2012 | Shi et al. |
| 8,333,008 B1 | 12/2012 | Sin et al. |
| 8,334,093 B2 | 12/2012 | Zhang et al. |
| 8,336,194 B2 | 12/2012 | Yuan et al. |
| 8,339,738 B1 | 12/2012 | Tran et al. |
| 8,341,826 B1 | 1/2013 | Jiang et al. |
| 8,343,319 B1 | 1/2013 | Li et al. |
| 8,343,364 B1 | 1/2013 | Gao et al. |
| 8,349,195 B1 | 1/2013 | Si et al. |
| 8,351,307 B1 | 1/2013 | Wolf et al. |
| 8,357,244 B1 | 1/2013 | Zhao et al. |
| 8,373,945 B1 | 2/2013 | Luo et al. |
| 8,374,025 B1 | 2/2013 | Ranjan et al. |
| 8,375,564 B1 | 2/2013 | Luo et al. |
| 8,375,565 B2 | 2/2013 | Hu et al. |
| 8,381,391 B2 | 2/2013 | Park et al. |
| 8,385,157 B1 | 2/2013 | Champion et al. |
| 8,385,158 B1 | 2/2013 | Hu et al. |
| 8,394,280 B1 | 3/2013 | Wan et al. |
| 8,400,731 B1 | 3/2013 | Li et al. |
| 8,404,128 B1 | 3/2013 | Zhang et al. |
| 8,404,129 B1 | 3/2013 | Luo et al. |
| 8,405,930 B1 | 3/2013 | Li et al. |
| 8,409,453 B1 | 4/2013 | Jiang et al. |
| 8,413,317 B1 | 4/2013 | Wan et al. |
| 8,416,540 B1 | 4/2013 | Li et al. |
| 8,419,953 B1 | 4/2013 | Su et al. |
| 8,419,954 B1 | 4/2013 | Chen et al. |
| 8,422,176 B1 | 4/2013 | Leng et al. |
| 8,422,342 B1 | 4/2013 | Lee |
| 8,422,841 B1 | 4/2013 | Shi et al. |
| 8,424,192 B1 | 4/2013 | Yang et al. |
| 8,441,756 B1 | 5/2013 | Sun et al. |

(56) References Cited

U.S. PATENT DOCUMENTS

| | | |
|---|---|---|
| 8,443,510 B1 | 5/2013 | Shi et al. |
| 8,444,866 B1 | 5/2013 | Guan et al. |
| 8,449,948 B2 | 5/2013 | Medina et al. |
| 8,451,556 B1 | 5/2013 | Wang et al. |
| 8,451,563 B1 | 5/2013 | Zhang et al. |
| 8,454,846 B1 | 6/2013 | Zhou et al. |
| 8,455,119 B1 | 6/2013 | Jiang et al. |
| 8,456,961 B1 | 6/2013 | Wang et al. |
| 8,456,963 B1 | 6/2013 | Hu et al. |
| 8,456,964 B1 | 6/2013 | Yuan et al. |
| 8,456,966 B1 | 6/2013 | Shi et al. |
| 8,456,967 B1 | 6/2013 | Mallary |
| 8,458,892 B2 | 6/2013 | Si et al. |
| 8,462,592 B1 | 6/2013 | Wolf et al. |
| 8,468,682 B1 | 6/2013 | Zhang |
| 8,472,288 B1 | 6/2013 | Wolf et al. |
| 8,476,925 B2 | 7/2013 | Zhu et al. |
| 8,480,911 B1 | 7/2013 | Osugi et al. |
| 8,486,285 B2 | 7/2013 | Zhou et al. |
| 8,486,286 B1 | 7/2013 | Gao et al. |
| 8,488,272 B1 | 7/2013 | Tran et al. |
| 8,491,801 B1 | 7/2013 | Tanner et al. |
| 8,491,802 B1 | 7/2013 | Gao et al. |
| 8,493,693 B1 | 7/2013 | Zheng et al. |
| 8,493,695 B1 | 7/2013 | Kaiser et al. |
| 8,495,813 B1 | 7/2013 | Hu et al. |
| 8,498,084 B1 | 7/2013 | Leng et al. |
| 8,506,828 B1 | 8/2013 | Osugi et al. |
| 8,514,517 B1 | 8/2013 | Batra et al. |
| 8,518,279 B1 | 8/2013 | Wang et al. |
| 8,518,832 B1 | 8/2013 | Yang et al. |
| 8,520,336 B1 | 8/2013 | Liu et al. |
| 8,520,337 B1 | 8/2013 | Liu et al. |
| 8,524,068 B2 | 9/2013 | Medina et al. |
| 8,526,275 B1 | 9/2013 | Yuan et al. |
| 8,531,801 B1 | 9/2013 | Xiao et al. |
| 8,532,450 B1 | 9/2013 | Wang et al. |
| 8,533,937 B1 | 9/2013 | Wang et al. |
| 8,537,494 B1 | 9/2013 | Pan et al. |
| 8,537,495 B1 | 9/2013 | Luo et al. |
| 8,537,502 B1 | 9/2013 | Park et al. |
| 8,545,999 B1 | 10/2013 | Leng et al. |
| 8,546,896 B2 | 10/2013 | Lottis et al. |
| 8,547,659 B1 | 10/2013 | Bai et al. |
| 8,547,667 B1 | 10/2013 | Roy et al. |
| 8,547,730 B1 | 10/2013 | Shen et al. |
| 8,547,731 B2 * | 10/2013 | Higo .............. G11C 11/16 257/421 |
| 8,555,486 B1 | 10/2013 | Medina et al. |
| 8,559,141 B1 | 10/2013 | Pakala et al. |
| 8,563,146 B1 | 10/2013 | Zhang et al. |
| 8,565,049 B1 | 10/2013 | Tanner et al. |
| 8,576,517 B1 | 11/2013 | Tran et al. |
| 8,578,594 B2 | 11/2013 | Jiang et al. |
| 8,582,238 B1 | 11/2013 | Liu et al. |
| 8,582,241 B1 | 11/2013 | Yu et al. |
| 8,582,253 B1 | 11/2013 | Zheng et al. |
| 8,588,039 B1 | 11/2013 | Shi et al. |
| 8,593,914 B2 | 11/2013 | Wang et al. |
| 8,597,528 B1 | 12/2013 | Roy et al. |
| 8,599,520 B1 | 12/2013 | Liu et al. |
| 8,599,657 B1 | 12/2013 | Lee |
| 8,603,593 B1 | 12/2013 | Roy et al. |
| 8,607,438 B1 | 12/2013 | Gao et al. |
| 8,607,439 B1 | 12/2013 | Wang et al. |
| 8,609,439 B2 * | 12/2013 | Prejbeanu .......... B82Y 25/00 257/421 |
| 8,611,035 B1 | 12/2013 | Bajikar et al. |
| 8,611,054 B1 | 12/2013 | Shang et al. |
| 8,611,055 B1 | 12/2013 | Pakala et al. |
| 8,614,864 B1 | 12/2013 | Hong et al. |
| 8,619,512 B1 | 12/2013 | Yuan et al. |
| 8,625,233 B1 | 1/2014 | Ji et al. |
| 8,625,941 B1 | 1/2014 | Shi et al. |
| 8,628,672 B1 | 1/2014 | Si et al. |
| 8,630,068 B1 | 1/2014 | Mauri et al. |
| 8,634,280 B1 | 1/2014 | Wang et al. |
| 8,638,529 B1 | 1/2014 | Leng et al. |
| 8,643,980 B1 | 2/2014 | Fowler et al. |
| 8,649,123 B1 | 2/2014 | Zhang et al. |
| 8,665,561 B1 | 3/2014 | Knutson et al. |
| 8,670,211 B1 | 3/2014 | Sun et al. |
| 8,670,213 B1 | 3/2014 | Zeng et al. |
| 8,670,214 B1 | 3/2014 | Knutson et al. |
| 8,670,294 B1 | 3/2014 | Shi et al. |
| 8,670,295 B1 | 3/2014 | Hu et al. |
| 8,675,318 B1 | 3/2014 | Ho et al. |
| 8,675,455 B1 | 3/2014 | Krichevsky et al. |
| 8,681,594 B1 | 3/2014 | Shi et al. |
| 8,689,430 B1 | 4/2014 | Chen et al. |
| 8,693,141 B1 | 4/2014 | Elliott et al. |
| 8,703,397 B1 | 4/2014 | Zeng et al. |
| 8,705,205 B1 | 4/2014 | Li et al. |
| 8,711,518 B1 | 4/2014 | Zeng et al. |
| 8,711,528 B1 | 4/2014 | Xiao et al. |
| 8,717,709 B1 | 5/2014 | Shi et al. |
| 8,720,044 B1 | 5/2014 | Tran et al. |
| 8,721,902 B1 | 5/2014 | Wang et al. |
| 8,724,259 B1 | 5/2014 | Liu et al. |
| 8,749,790 B1 | 6/2014 | Tanner et al. |
| 8,749,920 B1 | 6/2014 | Knutson et al. |
| 8,753,903 B1 | 6/2014 | Tanner et al. |
| 8,760,807 B1 | 6/2014 | Zhang et al. |
| 8,760,818 B1 | 6/2014 | Diao et al. |
| 8,760,819 B1 | 6/2014 | Liu et al. |
| 8,760,822 B1 | 6/2014 | Li et al. |
| 8,760,823 B1 | 6/2014 | Chen et al. |
| 8,763,235 B1 | 7/2014 | Wang et al. |
| 8,780,498 B1 | 7/2014 | Jiang et al. |
| 8,780,505 B1 | 7/2014 | Xiao |
| 8,786,983 B1 | 7/2014 | Liu et al. |
| 8,790,524 B1 | 7/2014 | Luo et al. |
| 8,790,527 B1 | 7/2014 | Luo et al. |
| 8,792,208 B1 | 7/2014 | Liu et al. |
| 8,792,312 B1 | 7/2014 | Wang et al. |
| 8,793,866 B1 | 8/2014 | Zhang et al. |
| 8,797,680 B1 | 8/2014 | Luo et al. |
| 8,797,684 B1 | 8/2014 | Tran et al. |
| 8,797,686 B1 | 8/2014 | Bai et al. |
| 8,797,692 B1 | 8/2014 | Guo et al. |
| 8,813,324 B2 | 8/2014 | Emley et al. |
| 2010/0290157 A1 | 11/2010 | Zhang et al. |
| 2011/0031569 A1 | 2/2011 | Watts et al. |
| 2011/0086240 A1 | 4/2011 | Xiang et al. |
| 2011/0159316 A1 | 6/2011 | Wang et al. |
| 2012/0063218 A1 | 3/2012 | Huai et al. |
| 2012/0111826 A1 | 5/2012 | Chen et al. |
| 2012/0216378 A1 | 8/2012 | Emley et al. |
| 2012/0237878 A1 | 9/2012 | Zeng et al. |
| 2012/0298621 A1 | 11/2012 | Gao |
| 2013/0059168 A1 | 3/2013 | Tahmasebi et al. |
| 2013/0064011 A1 | 3/2013 | Liu et al. |
| 2013/0216702 A1 | 8/2013 | Kaiser et al. |
| 2013/0216863 A1 | 8/2013 | Li et al. |
| 2013/0257421 A1 | 10/2013 | Shang et al. |
| 2013/0307097 A1 | 11/2013 | Yi et al. |
| 2014/0151829 A1 | 6/2014 | Watts et al. |
| 2014/0154529 A1 | 6/2014 | Yang et al. |
| 2014/0175050 A1 | 6/2014 | Zhang et al. |
| 2014/0175428 A1 | 6/2014 | Guo |
| 2014/0175581 A1 | 6/2014 | Guo |
| 2015/0129997 A1 * | 5/2015 | Tang .............. H01L 43/12 257/427 |

* cited by examiner

*FIG. 1*

*(PRIOR ART)*

SPIN TRANSFER TORQUE TUNNELING MAGNETORESISTIVE DEVICE HAVING A LAMINATED FREE LAYER WITH PERPENDICULAR MAGNETIC ANISOTROPY

BACKGROUND

Information storage devices are manufactured in high volume and widely used to store and/or retrieve data in computers and other consumer electronics devices. Information storage devices may be classified as volatile or non-volatile, depending upon whether their memory content is maintained when the information storage device is not powered. Examples of non-volatile information storage devices include magnetic hard disk drives and magnetic random access memory (MRAM) devices, either of which may utilize a magnetoresistive tunnel junction (MTJ) as part of information storage or retrieval operations. Specifically, whereas volatile random access memory (RAM) devices typically store data as electric charge, MRAM devices may store data in MTJs that maintain memory content even when the memory device is not powered.

Generally, each MTJ includes a reference layer that has a magnetic orientation that is pinned or fixed, and a free layer having a magnetic orientation that can be changed by an external magnetic field (e.g. from an adjacent disk or generated by a programming current). The MTJ is in a low resistance state when the free layer magnetic orientation is parallel to that of the reference layer, and in a high resistance state when the free layer magnetic orientation is anti-parallel to that of the reference layer. If the external magnetic field and/or programming current required to switch a desired MTJ between high and low resistance states (with acceptable switching speed) is too great, or if the MTJs are arranged too closely together, then one or more adjacent MTJs may undesirably be affected or inadvertently switched.

There have been many patented variations and improvements to MTJs in recent years, some of which help mitigate the foregoing problem to allow for more reliable operation when the MTJs are arranged in close proximity to each other. For example, a spin transfer torque magnetic random access memory (STT-MRAIVI) has been investigated, in which each MTJ is switched (i.e. "programmed") by an application of spin polarized current through the MTJ. The STT-MRAIVI promises significant advantages over magnetic-field-switched MRAIVI, which has been recently commercialized. For example, STT-MRAIVI can be scaled to a smaller size while maintaining the programmability of individual MTJs (without inadvertently and undesirably affecting the programming of adjacent MTJs). Moreover, STT-MRAIVI can be programmed with lesser programming currents, which reduces power consumption and associated requirements for heat dissipation.

However, one of the challenges for implementing STT-MRAIVI is minimizing the programming current required to quickly switch the magnetic orientation of the free layer in the MTJ, while maintaining high thermal stability of the recorded data. Reduced programming current may enable the use of smaller memory cell transistors, which can substantially reduce the overall size of the incorporating memory device. A reduced programming current requirement also corresponds to reduced voltages across the MTJs during writing and sensing, which may decrease the probability of tunneling barrier degradation and breakdown, and thereby improve the endurance and reliability of the incorporating memory device.

Hence, there is an ongoing need in the art for an improved MTJ that can quickly and reliably switch with acceptable thermal stability using a reduced programming current, and that is suitable for high volume manufacture and widespread durable use in reduced-scale data storage devices.

DESCRIPTION OF THE PREFERRED EMBODIMENTS

Figure 1:
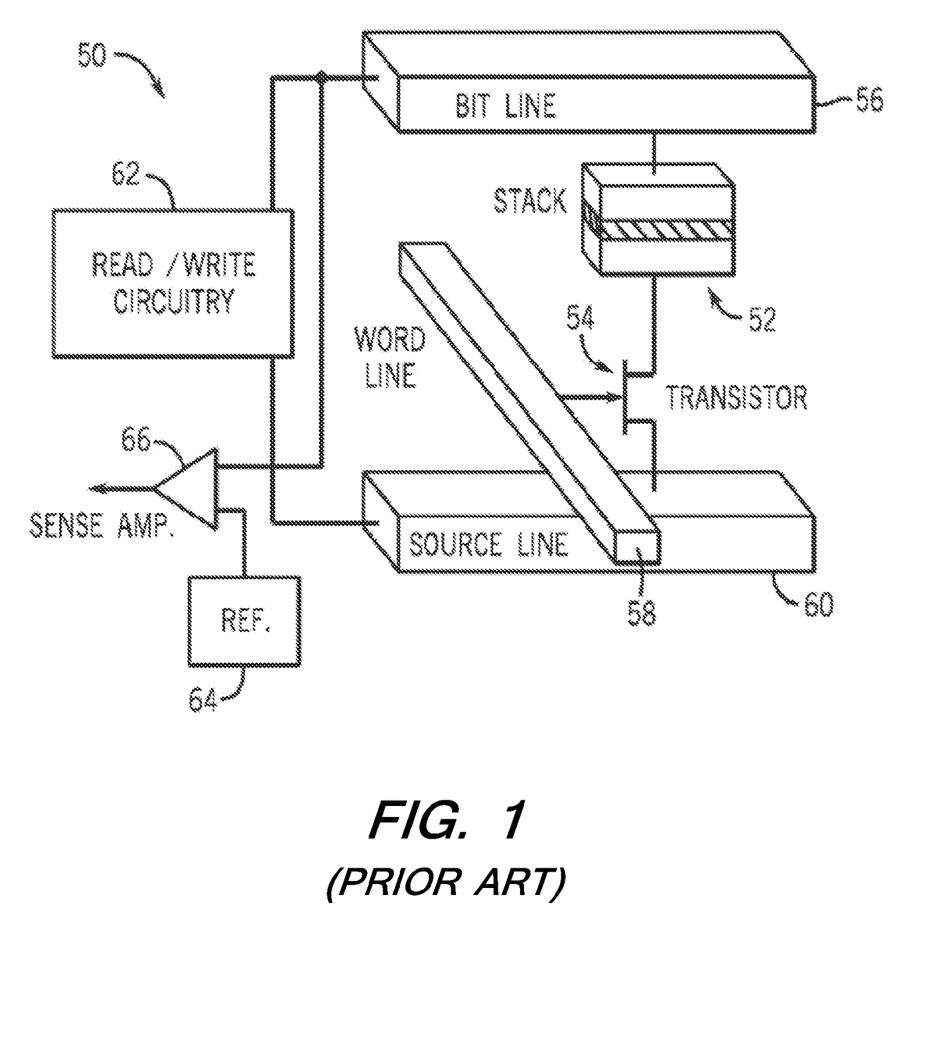
FIG. 1 is a schematic representation of a conventional MRAM cell that is capable of being improved by incorporating a spin transfer torque MTJ according to an embodiment of the present invention.

FIG. 1 is a schematic representation of a conventional MRAM cell 50 that is capable of operation with a conventional spin transfer torque MTJ, or being improved by incorporating a spin transfer torque MTJ according to an embodiment of the present invention.

Now referring to FIG. 1, the MRAM cell 50 includes a MTJ stack 52, an access transistor 54, a bit line 56, a word line 58, a source line 60, read/write circuitry 62, a bit line reference 64, and a sense amplifier 66. The MRAM cell 50 may be incorporated in an array of memory cells having a number of rows and columns. The MTJ stack 52 may optionally include a conventional spin transfer torque MTJ, or a spin transfer torque MTJ according to an embodiment of the present invention (described herein with specific reference to FIGS. 2 and 3).

When the MRAM cell 50 is selected to be programmed (in part by selective operation of the transistor 54 by word line 58), the read/write circuitry 62 applies a programming current through the MTJ stack 52 via the bit line 56, the source line 60, and the transistor 54. For example, the read/write circuitry 62 may apply a write voltage between the bit line 56 and the source line 60, with the polarity of such write voltage determining the remnant magnetization of the free layer in the MTJ stack 52. Specifically, the MTJ stack 52 may operate on a spin transfer torque principle, in which case electrons of the programming current become spin-polarized as the electrons pass through a spin filter layer of the MTJ stack 52. In that case, spin-polarized electrons of the programming current may exert a torque on the free layer of the MTJ stack 52, which can switch the polarity of the free layer during the writing operation.

To read the MRAM cell 50, a sensing current is used to detect the resistance state of the MTJ stack 52, with the sensing current being less than the programming current (so that sensing does not switch the free layer polarity in the MTJ stack 52). The read/write circuitry 62 may apply the sensing current to the MTJ stack 52 via the bit line 56, the source line 60, and the transistor 54. The programmed state of the MRAM cell 50 is sensed according to the resistance across the MTJ stack 52, which may be determined by the voltage difference between the bit line 56 and the source line 60. The voltage difference may optionally be compared to a reference 64 by a sense amplifier 66.

Figure 2:
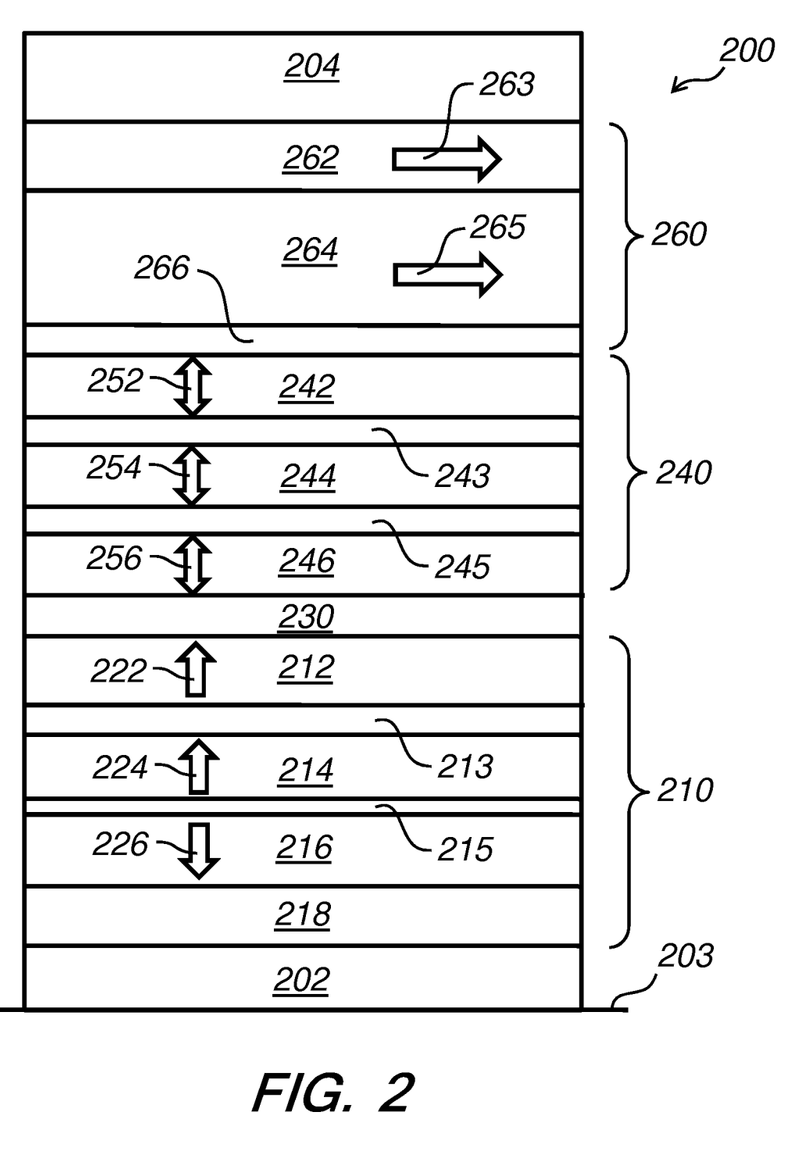
FIG. 2 is a cross-sectional diagram of a spin transfer torque MTJ according to certain embodiments of the present invention.

FIG. 2 is a cross-sectional diagram of a spin transfer torque MTJ 200 according to certain embodiments of the present invention. The spin transfer torque MTJ 200 includes an electrically conductive base electrode layer 202 defining a substrate plane 203. In certain embodiments, the spin transfer torque MTJ 200 may be fabricated on an electrically conductive substrate, with a remaining portion of the electrically conductive substrate serving as the electrically conductive base electrode layer 202. In certain alternative embodiments, the electrically conductive base electrode layer 202 may be fabricated as a metal layer (e.g. NiCr) deposited on a substrate (non-conductive, semi-conductive, or electrically conductive) that might be partially or wholly removed (e.g. by a conventional etching process).

In the embodiment of FIG. 2, a magnetic reference layer structure 210 is disposed on the base electrode layer 202. The magnetic reference layer structure 210 may include various sub-layers. For example, the magnetic reference layer structure 210 may include a pinned layer 212, for example comprising CoFeB. The magnetic reference layer structure 210 may also include a pair of antiferromagnetically coupled pinning layers 214, 216 separated by a thin non-magnetic dusting layer 215 (e.g. ruthenium). The magnetic reference layer structure 210 may optionally further include an outer layer 218 (optionally comprising an alloy of manganese, such as PtMn, IrMn, NiMn, FeMn), that is disposed adjacent to the base electrode layer 202.

In FIG. 2, the arrow 222 depicts a remnant magnetic field direction in the pinned layer 212, which corresponds to a magnetic anisotropy in the pinned layer 212 that is perpendicular to the substrate plane 203. The arrows 224, 226 depict the remnant magnetic field directions in the pinning layers 214, 216, respectively, each corresponding to a magnetic anisotropy that is perpendicular to the substrate plane 203. Note that the terms "perpendicular" and "parallel," as used herein do not require perfect perpendicularity or perfect parallelism, but rather approximate perpendicularity or approximate parallelism, respectively (e.g. within ±10° of the desired orientation).

In the embodiment of FIG. 2, the primary function of the reference layer structure 210 is to maintain the magnetic orientation 222 of the pinned layer 212 in a fixed (i.e. "pinned") orientation, despite magnetic torques that may be applied to the pinned layer 212 by spin polarized electrical currents passing through the spin transfer torque MTJ 200 for programming or sensing, and regardless of external magnetic fields that the spin transfer torque MTJ 200 might experience from its environment. The pinned layer 212 may be separated from the antiferromagnetically coupled pinning layers 214, 216, by a thin non-magnetic metallic layer 213 (e.g. tantalum).

In the embodiment of FIG. 2, an insulative barrier layer 230 is disposed on the laminated magnetic reference layer structure 210, so that the pinned layer 212 is disposed adjacent to the insulative barrier layer 230. In certain embodiments, the insulative barrier layer 230 may preferably comprise MgO having a thickness in the range of 8 Angstroms to 20 Angstroms, which in certain embodiments may provide a resistance area product ("RA") in the range 1 to 6 $\Omega \cdot \mu m^2$.

In the embodiment of FIG. 2, a laminated magnetic free layer 240 is disposed on the insulative barrier layer 230. In certain embodiments, the laminated magnetic free layer 240 may include at least three sublayers 242, 244, 246, each one being separated from an adjacent one by a non-magnetic metallic dusting layer. For example, in the embodiment of FIG. 2, the sublayer 242 is separated from the sublayer 244 by the non-magnetic metallic dusting layer 243, and the sublayer 244 is separated from the sublayer 246 by the non-magnetic metallic dusting layer 245. In the embodiment of FIG. 2, each of the non-magnetic metallic dusting layers 243, 245 may preferably be a tantalum dusting layer having a thickness in the range of 1 Angstroms to 7 Angstroms.

In the embodiment of FIG. 2, each of the sub-layers 242 and 246 of the laminated magnetic free layer 240 may preferably be a CoFeB sublayer having a thickness in the range of 6 Angstroms to 16 Angstroms. In certain embodiments, the sublayer 244 of the laminated magnetic free layer 240 may also be a CoFeB sublayer having a thickness in the range of 6 Angstroms to 16 Angstroms. In certain embodiments, the laminated magnetic free layer 240 preferably does not include more than four such CoFeB sublayers, each separated from an adjacent one by a tantalum dusting layer. However, in certain alternative embodiments, the sublayer 244 of the laminated magnetic free layer 240 may preferably comprise CoPt, FePt, or CoPd, and have a thickness in the range of 10 Angstroms to 30 Angstroms.

In the embodiment of FIG. 2, each of the arrows 252, 254, 256 depicts a remnant magnetic field direction in a corresponding sublayer 242, 244, 246 of the laminated magnetic free layer 240, respectively. The arrows 252, 254, 256 are shown as double-headed arrows as an indication that the laminated free layer 240 is intended to have a magnetization that is programmable (by the passage of a polarized current) to be aligned with, or counter-aligned against, the magnetic orientation 222 of the pinned layer 212. The arrows 252, 254, 256 are also drawn so as to indicate that the magnetic anisotropy of each of the sublayers 242, 244, 246 of the laminated magnetic free layer 240 is preferably oriented perpendicular to the substrate plane 203.

The presently disclosed structure and composition of the laminated free layer 240 of the embodiment of FIG. 2, and its anisotropy perpendicular to the substrate plane 203, may beneficially reduce the programming current required to change the magnetic orientation of the laminated free layer 240. By contrast, the required programming current may be undesirably higher if the sublayers 242, 244, 246 of the laminated free layer 240 instead comprised FePt and/or had anisotropy parallel to the substrate plane 203. Moreover, the presently disclosed structure and composition of the laminated free layer 240 of the embodiment of FIG. 2 may allow deposition at lower temperature, simplifying the manufacturing process and reducing the risk of thermal degradation to the fabricated spin transfer torque MTJ 200 and its tunneling magneto resistive (TMR) performance.

In the embodiment of FIG. 2, a current polarizing structure 260 is disposed on the laminated magnetic free layer 240. The current polarizing structure 260 may include a CoFeB polarizing layer 264 having a thickness greater than 20 Angstroms, and may optionally include a CoPd layer 262. In certain embodiments, the current polarizing structure 260 is preferably spaced from the laminated magnetic free layer 240 by a MgO spacer layer 266 that is adjacent to the laminated magnetic free layer 240. In such embodiments, the MgO spacer layer 266 preferably has a thickness in the range of 2 to 8 Angstroms, which may provide a resistance area product ("RA") in the range 0.2 to 0.8 $\Omega \cdot \mu m^2$—preferably substantially less than that of the insulative barrier layer 230.

In the embodiment of FIG. 2, each of the arrows 263, 265 depicts a remnant magnetic field direction in the CoPd layer 262 and the CoFeB polarizing layer 264, respectively. As depicted by the arrows 263, 265, the CoPd layer 262 and the CoFeB polarizing layer 264 have magnetic anisotropy that is parallel to the substrate plane 203.

In the embodiment of FIG. 2, the spin transfer torque MTJ 200 further includes an electrically conductive top electrode layer 204 that is disposed on the current polarizing structure 260, with the optional CoPd layer 262 of the current polarizing structure 260 being adjacent to the top electrode layer 204.

The aforedescribed arrangement and composition of the spin transfer torque MTJ 200 may enable perpendicular anisotropy of the magnetic laminated free layer 240, without the need to overly increase the iron content of the sublayers 242, 244, 246 or excessively decrease their thickness (to promote perpendicular anisotropy). The sublayers 242, 244, 246 may undesirably become super-paramagnetic and therefore thermally unstable if they were instead required to be excessively thin (where the memory cell size is small enough for practical use in modern data storage). Hence, the aforedescribed arrangement and composition of the spin transfer torque MTJ 200 may beneficially enable perpendicular anisotropy with thicker free layer laminates, and thereby increase switching speed and/or reduce the risk of thermal instability.

The aforedescribed sequence and order of deposition of the layers of the spin transfer torque MTJ 200 is not the only possible sequence or order of deposition according to the present invention. For example, FIG. 3 is a cross-sectional diagram of a spin transfer torque MTJ 300 according to certain alternative embodiments of the present invention that have a different sequence or order of layer deposition.

Figure 3:
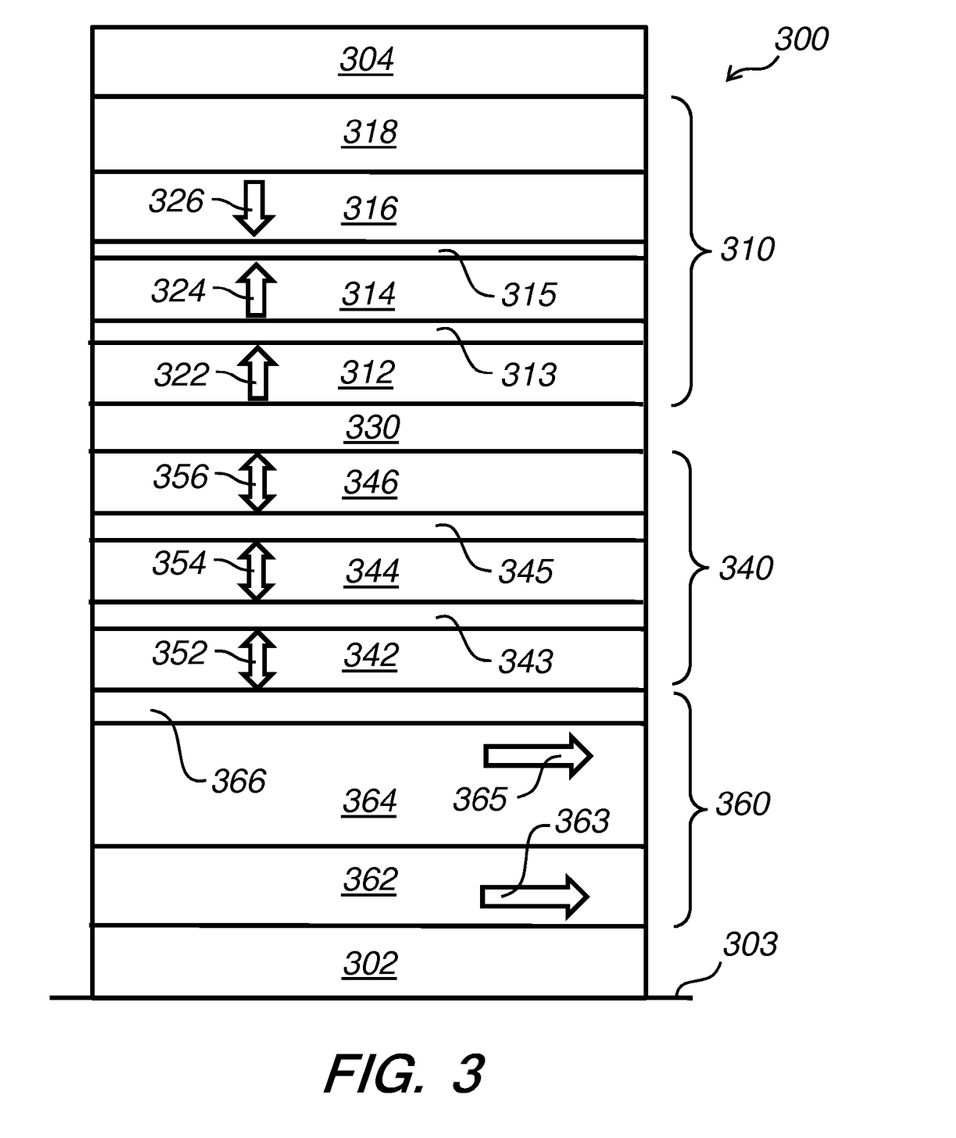
FIG. 3 is a cross-sectional diagram of a spin transfer torque MTJ according to certain alternative embodiments of the present invention.

The spin transfer torque MTJ 300 of FIG. 3 includes an electrically conductive base electrode layer 302 defining a substrate plane 303. In certain embodiments, the spin transfer torque MTJ 300 may be fabricated on an electrically conductive substrate, with a remaining portion of the electrically conductive substrate serving as the electrically conductive base electrode layer 302. In certain alternative embodiments, base electrode layer 302 may be fabricated as a metal layer (e.g. NiCr) deposited on a substrate (non-conductive, semi-conductive, or electrically conductive) that might be partially or wholly removed (e.g. by a conventional etching process).

In the embodiment of FIG. 3, a current polarizing structure 360 is disposed on the base electrode layer 302. The current polarizing structure 360 may include a CoFeB polarizing layer 364 having a thickness greater than 20 Angstroms, and may optionally include a CoPd layer 362. In the embodiment of FIG. 3, each of the arrows 363, 365 depicts a remnant magnetic field direction in the CoPd layer 362 and the CoFeB polarizing layer 364, respectively. As depicted by the arrows 363, 365, the CoPd layer 362 and the CoFeB polarizing layer 364 have magnetic anisotropy that is parallel to the substrate plane 303.

In the embodiment of FIG. 3, a laminated magnetic free layer 340 is disposed on the current polarizing structure 360. In certain embodiments, the laminated magnetic free layer 340 may include at least three sublayers 342, 344, 346, each one being separated from an adjacent one by a non-magnetic metallic dusting layer. For example, in the embodiment of FIG. 3, the sublayer 342 is separated from the sublayer 344 by the non-magnetic metallic dusting layer 343, and the sublayer 344 is separated from the sublayer 346 by the non-magnetic metallic dusting layer 345. In the embodiment of FIG. 3, each of the non-magnetic metallic dusting layers 343, 345 may preferably be a tantalum dusting layer having a thickness in the range of 1 Angstroms to 7 Angstroms.

In the embodiment of FIG. 3, each of the sub-layers 342 and 346 of the laminated magnetic free layer 340 may preferably be a CoFeB sublayer having a thickness in the range of 6 Angstroms to 16 Angstroms. In certain embodiments, the sublayer 344 of the laminated magnetic free layer 340 may also be a CoFeB sublayer having a thickness in the range of 6 Angstroms to 16 Angstroms. In certain embodiments, the laminated magnetic free layer 340 preferably does not include more than four such CoFeB sublayers, each separated from an adjacent one by a tantalum dusting layer. However, in certain alternative embodiments, the sublayer 344 of the laminated magnetic free layer 340 may preferably comprise CoPt, FePt, or CoPd, and have a thickness in the range of 10 Angstroms to 30 Angstroms.

In the embodiment of FIG. 3, each of the arrows 352, 354, 356 depicts a remnant magnetic field direction in a corresponding sublayer 342, 344, 346 of the laminated magnetic free layer 340, respectively. The arrows 352, 354, 356 are shown as double-headed arrows as an indication that the laminated free layer 340 is intended to have a magnetization that is programmable (by the passage of a polarized current) to be oriented vertically up or down in the view of FIG. 3. The arrows 352, 354, 356 are also drawn so as to indicate that the magnetic anisotropy of each of the sublayers 342, 344, 346 of the laminated magnetic free layer 340 is preferably oriented perpendicular to the substrate plane 303.

The presently disclosed structure and composition of the laminated free layer 340 of the embodiment of FIG. 3, and its anisotropy perpendicular to the substrate plane 303, may beneficially reduce the programming current required to change the magnetic orientation of the laminated free layer 340. By contrast, the required programming current may be undesirably higher if the sublayers 342, 344, 346 of the laminated free layer 340 instead comprised FePt and/or had anisotropy parallel to the substrate plane 303. Moreover, the presently disclosed structure and composition of the laminated free layer 340 of the embodiment of FIG. 3 may allow deposition at lower temperature, simplifying the manufacturing process and reducing the risk of thermal degradation to the fabricated spin transfer torque MTJ 300 and its tunneling magneto resistive (TMR) performance.

In the embodiment of FIG. 3, an insulative barrier layer 330 is disposed on the laminated magnetic free layer 340, so that the sublayer 346 is disposed adjacent to the insulative barrier layer 330. In certain embodiments, the insulative barrier layer 330 may preferably comprise MgO having a thickness in the range of 8 Angstroms to 20 Angstroms, which in certain embodiments may provide a resistance area product ("RA") in the range 1 to 6 $\Omega \cdot \mu m^2$.

In certain embodiments, the current polarizing structure 360 is preferably spaced from the laminated magnetic free layer 340 by a MgO spacer layer 366 that is adjacent to the laminated magnetic free layer 340. In such embodiments, the MgO spacer layer 366 preferably has a thickness in the range of 2 to 8 Angstroms, which may provide a resistance area product ("RA") in the range 0.2 to 0.8 $\Omega \cdot \mu m^2$—preferably substantially less than that of the insulative barrier layer 330.

In the embodiment of FIG. 3, a magnetic reference layer structure 310 is disposed on the insulative barrier layer 330. The magnetic reference layer structure 310 may include various sub-layers. For example, the magnetic reference layer structure 310 may include a pinned layer 312, for example comprising CoFeB. In the embodiment of FIG. 3, the pinned layer 312 is disposed adjacent to the insulative barrier layer 330.

The magnetic reference layer structure 310 may also include a pair of antiferromagnetically coupled pinning layers 314, 316 separated by a thin non-magnetic dusting layer 315 (e.g. ruthenium). The magnetic reference layer structure 310 may optionally further include an outer layer 318 (optionally comprising an alloy of manganese, such as PtMn, IrMn, NiMn, FeMn).

In FIG. 3, the arrow 322 depicts a remnant magnetic field direction in the pinned layer 312, which corresponds to a magnetic anisotropy in the pinned layer 312 that is perpendicular to the substrate plane 303. The arrows 324, 326 depict the remnant magnetic field directions in the pinning layers 314, 316, respectively, each corresponding to a magnetic anisotropy that is perpendicular to the substrate plane 303.

In the embodiment of FIG. 3, the primary function of the reference layer structure 310 is to maintain the magnetic orientation 322 of the pinned layer 312 in a fixed (i.e. "pinned") orientation, despite magnetic torques that may be applied to the pinned layer 312 by spin polarized electrical currents passing through the spin transfer torque MTJ 300 for programming or sensing, and regardless of external magnetic fields that the spin transfer torque MTJ 300 might experience from its environment. The pinned layer 312 may be separated from the antiferromagnetically coupled pinning layers 314, 316, by a thin non-magnetic metallic layer 313 (e.g. tantalum).

In the embodiment of FIG. 3, the spin transfer torque MTJ 300 further includes an electrically conductive top electrode layer 304 that is disposed on the reference layer structure 310, with the outer layer 318 of the reference layer structure 310 being adjacent to the top electrode layer 304.

The aforedescribed arrangement and composition of the spin transfer torque MTJ 300 may enable perpendicular anisotropy of the magnetic laminated free layer 340, without the need to overly increase the iron content of the sublayers 342, 344, 346 or excessively decrease their thickness (to promote perpendicular anisotropy). The sublayers 342, 344, 346 may undesirably become super-paramagnetic and therefore thermally unstable if they were instead required to be excessively thin (where the memory cell size is small enough for practical use in modern data storage). Hence, the aforedescribed arrangement and composition of the spin transfer torque MTJ 300 may beneficially enable perpendicular anisotropy with thicker free layer laminates, and thereby increase switching speed and/or reduce the risk of thermal instability.

In the foregoing specification, the invention is described with reference to specific exemplary embodiments, but those skilled in the art will recognize that the invention is not limited to those. It is contemplated that various features and aspects of the invention may be used individually or jointly and possibly in a different environment or application. The specification and drawings are, accordingly, to be regarded as illustrative and exemplary rather than restrictive. For example, the word "preferably," and the phrase "preferably but not necessarily," are used synonymously herein to consistently include the meaning of "not necessarily" or optionally. The drawings are not necessarily to scale. "Comprising," "including," and "having," are intended to be open-ended terms.

What is claimed is:

1. A spin transfer torque magnetic junction comprising:
   an electrically conductive base electrode layer defining a substrate plane;
   a magnetic reference layer structure disposed on the base electrode layer and having magnetic anisotropy perpendicular to the substrate plane;
   an insulative barrier layer disposed on the laminated magnetic reference layer structure;
   a laminated magnetic free layer disposed on the insulative barrier layer and having magnetic anisotropy perpendicular to the substrate plane,
   a current polarizing structure disposed on the laminated magnetic free layer and having magnetic anisotropy parallel to the substrate plane;
   an electrically conductive top electrode layer disposed on the current polarizing structure;
   wherein the laminated magnetic free layer comprises at least three sublayers of CoFeB, each CoFeB sublayer having a thickness in the range of 6 Angstroms to 16 Angstroms and being separated from an adjacent CoFeB sublayer by one of a plurality of tantalum dusting layers.

2. The spin transfer torque magnetic junction of claim 1 wherein the laminated magnetic free layer comprises no more than four sublayers of CoFeB.

3. The spin transfer torque magnetic junction of claim 1 wherein each of the plurality of tantalum dusting layers has a thickness in the range of 1 Angstroms to 7 Angstroms.

4. The spin transfer torque magnetic junction of claim 1 wherein the current polarizing structure comprises a CoPd layer that is adjacent to the top electrode layer, a CoFeB polarizing layer having a thickness greater than 20 Angstroms, and a MgO spacer layer that is adjacent to the laminated magnetic free layer and that has a thickness in the range of 2 to 8 Angstroms.

5. The spin transfer torque magnetic junction of claim 1 wherein the magnetic reference layer structure comprises a pinned layer comprising CoFeB that is disposed adjacent the insulative barrier layer, and a pair of antiferromagnetically coupled pinning layers, each having magnetic anisotropy perpendicular to the substrate plane.

6. The spin transfer torque magnetic junction of claim 5 wherein the magnetic reference layer structure further comprises an outer layer comprising an alloy of manganese that is disposed adjacent to the base electrode layer.

7. The spin transfer torque magnetic junction of claim 1 wherein the insulative barrier layer comprises MgO having a thickness in the range of 8 Angstroms to 20 Angstroms.

8. A spin transfer torque magnetic junction comprising:
   an electrically conductive base electrode layer defining a substrate plane;
   a current polarizing structure disposed on the base electrode layer and having magnetic anisotropy parallel to the substrate plane;
   a laminated magnetic free layer disposed on the current polarizing structure and having magnetic anisotropy perpendicular to the substrate plane;
   an insulative barrier layer disposed on the laminated magnetic free layer;
   a magnetic reference layer structure disposed on the insulative barrier layer and having magnetic anisotropy perpendicular to the substrate plane;
   an electrically conductive top electrode disposed on the magnetic reference layer structure;
   wherein the laminated magnetic free layer comprises at least three sublayers of CoFeB, each CoFeB sublayer having a thickness in the range of 6 Angstroms to 16 Angstroms and being separated from an adjacent CoFeB sublayer by one of a plurality of tantalum dusting layers.

9. The spin transfer torque magnetic junction of claim 8 wherein each of the plurality of tantalum dusting layers has a thickness in the range of 1 Angstroms to 7 Angstroms.

10. The spin transfer torque magnetic junction of claim 8 wherein the current polarizing structure comprises a CoPd layer that is adjacent to the base electrode layer, a CoFeB polarizing layer having a thickness greater than 20 Angstroms, and a MgO spacer layer that is adjacent to the laminated magnetic free layer and that has a thickness in the range of 2 to 8 Angstroms.

11. The spin transfer torque magnetic junction of claim 8 wherein the magnetic reference layer structure comprises a pinned layer comprising CoFeB that is disposed adjacent the insulative barrier layer, and a pair of antiferromagnetically coupled pinning layers, each having magnetic anisotropy perpendicular to the substrate plane.

12. The spin transfer torque magnetic junction of claim 11 wherein the magnetic reference layer structure further comprises an outer layer comprising an alloy of manganese that is disposed adjacent to the top electrode layer.

13. The spin transfer torque magnetic junction of claim 11 wherein the insulative barrier layer comprises MgO having a thickness in the range of 8 Angstroms to 20 Angstroms.

14. The spin transfer torque magnetic junction of claim 11 wherein the laminated magnetic free layer comprises no more than four sublayers of CoFeB.

15. A spin transfer torque magnetic junction comprising:
an electrically conductive base electrode defining a substrate plane;
a magnetic reference layer structure disposed on the base electrode and having magnetic anisotropy perpendicular to the substrate plane;
an insulative barrier layer disposed on the laminated magnetic reference layer;
a laminated magnetic free layer disposed on the insulative barrier layer and having magnetic anisotropy perpendicular to the substrate plane;
a current polarizing structure disposed on the laminated magnetic free layer and having magnetic anisotropy parallel to the substrate plane;
an electrically conductive top electrode disposed on the current polarizing structure;
wherein the laminated magnetic free layer comprises first and third sublayers of CoFeB, each having a CoFeB sublayer thickness in the range of 6 Angstroms to 16 Angstroms, and a second sublayer comprising a ferromagnetic material selected form the group consisting of CoPt, FePt, and CoPd, and having a second sublayer thickness in the range of 10 Angstroms to 30 Angstroms; and
wherein the first and second sublayers are separated by a first tantalum dusting layer, and the second and third sublayers are separated by a second tantalum dusting layer.

16. The spin transfer torque magnetic junction of claim 15 wherein each of the first and second tantalum dusting layers has a thickness in the range of 1 Angstroms to 7 Angstroms.

17. The spin transfer torque magnetic junction of claim 15 wherein the current polarizing structure comprises a CoPd layer that is adjacent to the top electrode layer, a CoFeB polarizing layer having a thickness greater than 20 Angstroms, and a MgO spacer layer that is adjacent to the laminated magnetic free layer and that has a thickness in the range of 2 to 8 Angstroms.

18. The spin transfer torque magnetic junction of claim 15 wherein the magnetic reference layer structure comprises a pinned layer comprising CoFeB that is disposed adjacent the insulative barrier layer, and a pair of antiferromagnetically coupled pinning layers, each having magnetic anisotropy perpendicular to the substrate plane.

19. The spin transfer torque magnetic junction of claim 18 wherein the magnetic reference layer structure further comprises an outer layer comprising an alloy of manganese that is disposed adjacent to the base electrode layer.

20. The spin transfer torque magnetic junction of claim 15 wherein the insulative barrier layer comprises MgO having a thickness in the range of 8 Angstroms to 20 Angstroms.

* * * * *